(12) United States Patent
O'Connor

(10) Patent No.: US 8,217,813 B2
(45) Date of Patent: Jul. 10, 2012

(54) SYSTEM AND METHOD FOR LOW-LATENCY DATA COMPRESSION/DECOMPRESSION

(75) Inventor: James Michael O'Connor, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 129 days.

(21) Appl. No.: 12/770,430

(22) Filed: Apr. 29, 2010

(65) Prior Publication Data

US 2011/0271055 A1 Nov. 3, 2011

(51) Int. Cl.
*H03M 7/00* (2006.01)
(52) U.S. Cl. ......... 341/87; 341/50; 341/51; 341/65; 341/106; 382/233; 382/236; 382/238; 382/240
(58) Field of Classification Search ............ 341/50, 341/51, 65, 87, 106; 382/233, 398, 238, 382/240
See application file for complete search history.

(56) References Cited

U.S. PATENT DOCUMENTS

| | | | | |
|---|---|---|---|---|
| 5,389,922 | A * | 2/1995 | Seroussi et al. | 341/51 |
| 5,729,228 | A * | 3/1998 | Franaszek et al. | 341/106 |
| 6,489,902 | B2 * | 12/2002 | Heath | 341/87 |
| 6,847,315 | B2 * | 1/2005 | Castelli et al. | 341/87 |
| 6,892,292 | B2 * | 5/2005 | Henkel et al. | 712/200 |
| 6,961,009 | B2 * | 11/2005 | McCanne et al. | 341/51 |
| 7,047,382 | B2 * | 5/2006 | Geiger et al. | 711/165 |
| 7,554,464 | B1 * | 6/2009 | Oberdorfer | 341/55 |
| 8,054,879 | B2 * | 11/2011 | Fallon et al. | 375/240 |
| 8,073,047 | B2 * | 12/2011 | Fallon et al. | 375/240 |
| 8,120,516 | B2 * | 2/2012 | Archbold et al. | 341/106 |
| 2004/0098545 | A1 | 5/2004 | Pline et al. | |
| 2004/0111710 | A1 * | 6/2004 | Chakradhar et al. | 717/136 |
| 2005/0071151 | A1 * | 3/2005 | Adl-Tabatabai et al. | 704/10 |
| 2007/0226428 | A1 | 9/2007 | Tremaine et al. | |
| 2010/0223237 | A1 * | 9/2010 | Mishra et al. | 707/693 |

OTHER PUBLICATIONS

Abali, B., et al., "Memory Expansion Technology (MXT): Software Support and Performance," IBM Journal of Research and Development, vol. 45, No. 2, pp. 287-301, (15 pages) Mar. 2001.
Abali, Bulent, et al., "Performance of Hardware Compressed Main Memory," Proceedings of the Seventh IEEE Symposium on High-Performance Computer Architecture, pp. 73-81, (9 pages) Jan. 2001.
Adl-Tabatabai, Ali-Reza et al., "Compression in Cache Design," Proceedings of the 21st Annual International Conference on Supercomputing, 12 pages, Jun. 2007.
Alameldeen, Alaa R. and Wood, David A., "Adaptive Cache Compression for High Performance Processors," Proceedings of the 31st Annual International Symposium on Computer Architecture, pp. 212-223, (12 pages) Jun. 2004.

(Continued)

*Primary Examiner* — Linh Nguyen
(74) *Attorney, Agent, or Firm* — Zagorin O'Brien Graham LLP

(57) ABSTRACT

A compression technique includes storing respective fixed-size symbols for each of a plurality of words in a data block, e.g., a cache line, into a symbol portion of a compressed data block, e.g., a compressed cache line, where each of the symbols provides information about a corresponding one of the words in the data block. Up to a first plurality of data segments are stored in a data portion of the compressed data block, each data segment corresponds to a unique one of the symbols in the compressed data block and a unique one of the words in the cache line. Up to a second plurality of dictionary entries are stored in the data portion of the compressed cache line. The dictionary entries can correspond to multiple ones of the symbols.

33 Claims, 9 Drawing Sheets

OTHER PUBLICATIONS

Alameldeen, Alaa R. and Wood, David A., "Interactions Between Compression and Prefetching in Chip Multiprocessors," Proceedings of the 13th Annual International Symposium on High-Performance Computer Architecture, pp. 228-239, (12 pages) Feb. 2007.

Alameldeen, Alaa R. and Wood, David A., Frequent Pattern Compression: A Significance-Based Compression Scheme for L2 Caches, Technical Report CS-TR-2004-1500, Computer Sciences Department University of Wisconsin—Madison, 14 pages, Apr. 2004.

Alameldeen, Alaa R., "Using Compression to Improve Chip Multiprocessor Performance," Ph.D. dissertation, Computer Sciences Department, University of Wisconsin-Madison, 228 pages, Mar. 2006.

Chen, Xi, et al., "Design and Implementation of a High-Performance Microprocessor Cache Compression Algorithm," Proceedings of 2008 Data Compression Conference (DCC 2008), pp. 43-52 (10 pages) Mar. 2008.

Cheng, Howard and Li, Xiaobo, "Partial Encryption of Compressed Images and Videos," IEEE Transactions on Signal Processing, vol. 48, No. 8, pp. 2439-2451, (33 pages) Aug. 2000.

Ekman, Magnus and Stenstrom, Per, "A Robust Main-Memory Compression Scheme," Proceedings of the 32nd Annual International Symposium on Computer Architecture, pp. 74-85, (12 pages) Jun. 2005.

Franaszek, P. A. and Robinson, J. T., "On Internal Organization in Compressed Random-Access Memories," IBM Journal of Research and Development, vol. 45, No. 2, pp. 259 270, (12 pages) Mar. 2001.

Franaszek, Peter et al., "Parallel Compression with Cooperative Dictionary Construction," Proceedings of the Data Compression Conference, pp. 200 209, (10 pages) Mar. 1996.

Hallnor, Erik G. and Reinhardt, Steven K., "A Fully Associative Software-Managed Cache Design," Proceedings of the 27th Annual International Symposium on Computer Architecture, pp. 107-116, (10 pages) Jun. 2000.

Hallnor, Erik G. and Reinhardt, Steven K., "A Unified Compressed Memory Hierarchy," Proceedings of the Eleventh IEEE Symposium on High-Performance Computer Architecture, pp. 201 212, (12 pages) Feb. 2005.

International Technology Roadmap for Semiconductors, 2006 Update—Overview and Working Group Summaries, http://www.itrs.net/Links/2006Update/FinalToPost/00_ExecSum2006Update.pdf, 46 pages, 2006.

Kant, Krishna, "An Evaluation of Memory Compression Alternatives," presented at CAECW'03 (Workshop on Computer Architecture Evaluation using Commercial Workloads),10 pages, Feb. 9, 2003.

Kjelsø, Morten et al., "Design and Performance of a Main Memory Hardware Data Compressor," Proceedings of the 22nd Euromicro Conference, 8 pages, Sep. 1996.

Lee, Jang-Soo et al., "Design and Evaluation of a Selective Compressed Memory System," Proceedings of International Conference on Computer Design, pp. 184-191, (8 pages) Oct. 1999.

Lekatsas, Haris et al., "Cypress: Compression and Encryption of Data and Code for Embedded Multimedia Systems," IEEE Design and Test of Computers, vol. 21, No. 5, pp. 406-415, (10 pages) Sep./Oct. 2004.

Tremaine, R. B. et al., "IBM Memory Expansion Technology (MXT)," IBM Journal of Research and Development, vol. 45, No. 2, pp. 271-285, (15 pages) Mar. 2001.

Tremaine, R. Brett et al., "Pinnacle: IBM MXT in a Memory Controller Chip," IEEE Micro, vol. 21, No. 2, pp. 56 68, (13 pages) Mar./Apr. 2001.

Yang, Jun et al., "Frequent Value Compression in Data Caches," Proceedings of the 33rd IEEE/ACM International Symposium on Microarchitecture, pp. 258-265, (8 pages) Dec. 2000.

Yim, Keun Soo et al, "Performance Analysis of On-Chip Cache and Main Memory Compression Systems for High-End Parallel Computers," Proceedings of the International Conference on Parallel and Distributed Processing Techniques and Applications, pp. 469-475, (7 pages) Jun. 2004.

Zhang, Youtao et al., "Frequent Value Locality and Value-Centric Data Cache Design," Proceedings of the Ninth ACM International Conference on Architectural Support for Programming Languages and Operating Systems, pp. 150-159, (7 pages) Nov. 2000.

Ziv, Jacob and Lempel, Abraham, "A Universal Algorithm for Sequential Data Compression," IEEE Transactions on Information Theory, vol. 23, No. 3, 337-343, (7 pages) May 1977.

* cited by examiner

| Symbol | Word |
|---|---|
| 00xx | Match dictionary word 0..3 |
| 010x | Match dictionary word 4..5 |
| 0110 | Constant word 0x00000000 |
| 0111 | Constant word 0xFFFFFFFF |
| 10xx+<16-bit data> | Match for dictionary word 0..3 for most-significant 16 bits, Least-significant 16 bits come from <16-bit data> |
| 1100+<16-bit data> | Match for dictionary word 4 for most-significant 16-bits, Least-significant 16-bits come from <16-bit data> |
| 1101+<16-bit data> | Two zero-extended bytes (e.g. 0x00aa00bb where aa and bb are from <16-bit data>) - Good for Unicode strings of ASCII characters |
| 1110+<16-bit data> | <16-bit data> extended with 0x0000 as the most-significant halfword |
| 1111+<16-bit data> | <16-bit data> extended with 0xFFFF as the most-significant halfword |

FIG. 3

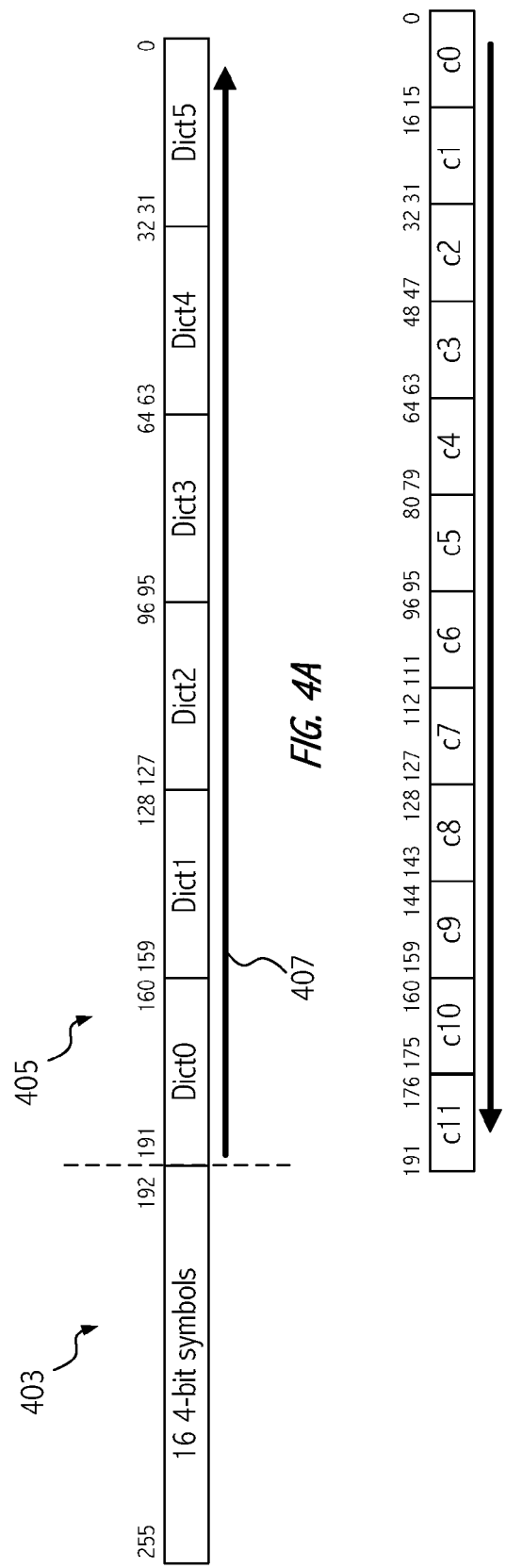

| Encoded Value | Uncompressed Word |
|---|---|
| 00 + <2-bit index> | dictionary [2-bit index] |
| 010 + <1-bit index> | dictionary[4 + 1-bit index] |
| 0110 | <32 zeros> |
| 0111 | <32 ones> |
| 10 + <2-bit index> + <16-bit data> | dictionary [2-bit index][31:15] + <16-bit data> |
| 1100 + <16-bit data> | dictionary[4][31:16] + <16-bit data> |
| 1101 + <16-bit data> | <8 zeros> + <16-bit data>[15:8] + <8 zeros> + <16-bit data>[7:0] |
| 1110 + <16-bit data> | <16 zeros> + <16-bit data> |
| 1111 + <16-bit data> | <16 ones> + <16-bit data> |

FIG. 5

SYSTEM AND METHOD FOR LOW-LATENCY DATA COMPRESSION/DECOMPRESSION

BACKGROUND

1. Field of the Invention

This invention relates to data and more particularly to compression of data.

2. Description of the Related Art

The growing gap between on-chip compute resources and the external memory system bandwidth has been an active area of research for decades. The computation throughput available on a chip continues to grow at a rate much faster than the total available off-chip I/O bandwidth. This trend is expected to continue for the foreseeable future. To date, the primary approach to addressing this gap has been the increasing use of large on-die caches. For many applications, these caches have been effective at reducing the bandwidth demands to main memory. Other applications, however, have working sets that do not fit into the on-die caches, and are significantly limited by bandwidth to off-chip memory.

Certain server-related trends, such as throughput or cloud computing, are increasing the stress on cache and main memory performance. Throughput computing is a market that is expected to see a high degree of growth in the next decade because of the increase in the number of server farms. The applications in this market are characterized as having a large number of independent threads, and, unlike high performance computing (HPC) applications, each thread is generally not compute intensive. The performance of the core is less important than the performance of the cache, memory, and I/O subsystem. For instance, cloud computing workloads typically consist of many virtualized environments—leading to large memory (and cache) footprints for these workloads.

Cache compression offers the promise of increased effective cache capacity without a corresponding increase in cache SRAM (with its associated die area and power costs). In addition, cache compression results in reduced memory bandwidth requirements for a given workload. Thus, there are power and performance advantages for cache compression. However, cache compression results in increased die area for the logic utilized for compression/decompression and increased latency due to the need to decompress the compressed cache line before use.

It would be desirable to achieve the benefits of cache compression with both reasonable compression rates and appropriate decompression latency.

SUMMARY OF EMBODIMENTS OF THE INVENTION

Data compression techniques hold promise for improving performance per area, performance per memory channel, and performance per watt.

Accordingly, an embodiment of the invention provides a method of compressing a data block that includes storing respective fixed-size symbols for each of a plurality of words in the data block in a symbol portion of a compressed data block, each of the symbols providing information about a corresponding one of the words in the data block. The method further includes storing in a data portion of the compressed data block one or more data segments, each data segment corresponding to a unique one of the symbols in the compressed data block and a unique one of the words in the data block. One or more dictionary entries are stored in the data portion of the compressed data block, at least one of the dictionary entries corresponding to multiple ones of the symbols. In an embodiment the data block is a cache line and the compressed data block is a compressed cache line.

In another embodiment, a method is provided for decompressing a compressed data block having a data portion and a symbol portion having a plurality of fixed-width symbols, to form a data block. The method includes determining, according to a first value of one of the plurality of fixed-width symbols, that the one of the plurality of fixed-width symbols has a corresponding data segment stored in the data portion that is uniquely associated with only the one of the fixed-width symbols, and determining, according to a second value of another of the fixed-width symbols that the other fixed-width symbol has a dictionary entry associated with the symbol, wherein the dictionary entry and the data segment are of different bit lengths. The method further includes generating the data block to include a first word associated with the one of the plurality of fixed-width symbols, having the data segment uniquely associated with only one word of the data block, the data block further including at least a second word that equals the dictionary entry. In an embodiment the data block is a cache line and the compressed data block is a compressed cache line.

In another embodiment an apparatus is provided that includes a compressed data block storage to store a compressed data block of a first plurality of words, the compressed data block storage includes a symbol portion of equally sized symbols for each word stored in the compressed data block and a data portion. The data portion includes one or more word size dictionary entries and one or more second plurality of data segments, wherein each data segment is used to decompress only one word for the uncompressed data block, and each dictionary entry is used to decompress one or more of the words. Selection logic is coupled to the compressed data block to generate, according to a value of the symbol associated with a particular one of the words, a decompressed word that includes as at least part of the decompressed word one of, a data segment, a dictionary entry, and one or more predetermined values. In an embodiment the data block is a cache line and the compressed data block is a compressed cache line.

In still another embodiment, an apparatus includes a data block storage to store a plurality of words and a compressed data block storage having a symbol portion and a shared data pool portion. Determination logic traverses the compressed data block in a fixed ordering and determines to store a word in the compressed data block storage as a dictionary entry in the shared data pool portion if the word is equal to a word later in the fixed ordering and not earlier in the fixed ordering and if a first portion of the word matches the first portion of a word later in the fixed ordering and not earlier in the fixed ordering. The determination logic is further configured to determine to store half of a word in the shared data pool portion if a portion of a word matches one or more predetermined values, and if half of the word matches half of a word earlier in the fixed ordering. In an embodiment the data block is a cache line and the compressed data block is a compressed cache line.

BRIEF DESCRIPTION OF THE DRAWINGS

The present invention may be better understood, and its numerous objects, features, and advantages made apparent to those skilled in the art by referencing the accompanying drawings.

FIG. 3 illustrates exemplary coding for fixed-size symbols

FIG. 4A shows an exemplary compressed cache line having all dictionary entries according to an embodiment of the invention.

FIG. 4B shows the allocation of 16-bit data values in the compressed cache line according to an embodiment of the invention.

FIG. 4C shows an exemplary compressed cache line having both dictionary entries and unique 16-bit data values according to an embodiment of the invention.

FIG. 5 illustrates decompression according to an embodiment of the invention.

The use of the same reference symbols in different drawings indicates similar or identical items.

DETAILED DESCRIPTION

Figure 1:
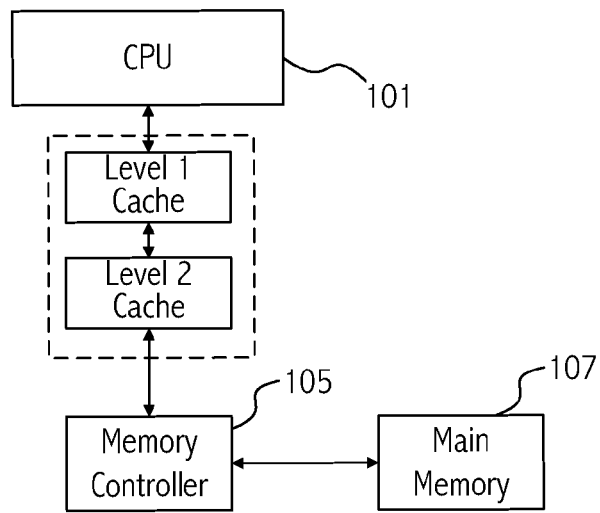
FIG. 1 shows is an exemplary cache architecture.
Figure 2:
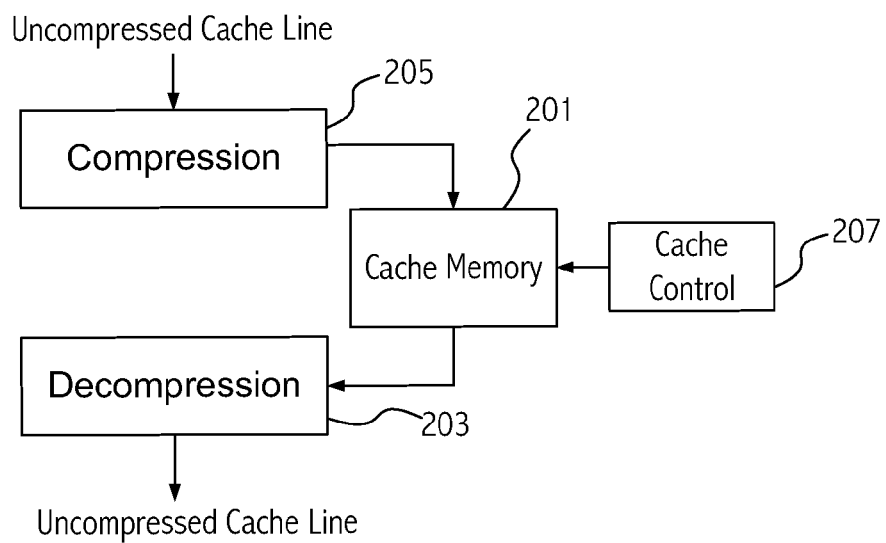
FIG. 2 illustrates a high-level block diagram of the cache architecture including the compression and decompression architecture according to an embodiment of the invention.

Referring to FIG. 1, illustrated is an exemplary cache architecture. The illustrated embodiment includes a CPU 101 and a two-level (L1 and L2) cache memory 103 between the CPU 101 and the memory controller 105 and main memory 107. While the illustrated cache memory includes an L1 and an L2 cache, additional levels of cache memory, e.g., an L3 cache, may be employed according to system requirements. FIG. 2 illustrates a high-level block diagram of the cache architecture including the compression and decompression architecture according to an embodiment of the invention. When the cache memory 201 is read, which may be, e.g., an L3 cache memory, decompression logic 203 decompresses those cache lines that are compressed. A bit in the cache tag is used to indicate whether the cache line is compressed. Note that the cache tag memory and logic, cache eviction, and other traditional cache control functionality are not separately illustrated in FIG. 2 to simplify the figure. The control functionality is simply shown as cache control 207. When the cache line is written to the cache memory, compression logic 205 determines whether the cache line can be compressed and, if so, compresses the cache line and supplies it to the cache memory as described further herein.

The additional latency introduced by decompression in any caching scheme is a critical factor affecting the overall performance. An embodiment of the invention provides a compression scheme that compresses a 64 byte cache line by a factor of two to 32 bytes. By targeting a specific compression ratio, which is desirable due to constraints in implementing a simple compressed cache scheme, the approach is able to decompress a 32 bytes cache line to 64 bytes with very low latency (e.g., a single clock cycle). Note that cache compression may significantly reduce traffic to main memory and thus provide substantial bandwidth savings to main memory in the compressed cache scheme. For example, in one estimate, approximately 10-18% of all traffic to main memory may be eliminated. In addition, there may also be a performance upside from the potential reduction in memory latency that may occur with reduced bandwidth demands.

The additional die area and complexity that are required to implement a compressed cache scheme are non-trivial, but are fairly localized. Low-latency cache decompression is important to realizing practical schemes that do not significantly adversely affect workloads that are not benefitted by the increased effective cache capacity via compression. In integrated circuits incorporating both central processing unit(s) (CPUs) and graphics processing unit(s) (GPUs), memory-bandwidth reductions due to a compressed cache approach may prove particularly valuable, where the reduced CPU bandwidth demands can result in increased bandwidth availability for the GPU.

As is true with almost any performance improvement, note that cache compression performance improvement can be traded for area and/or power savings. Thus, while performance increases may be realized using cache compression, the performance could be "held constant" and the benefits of cache compression could be realized as reduced die area and/or reduced power.

As stated earlier, decompression latency is a critical component of the overall performance in a compressed cache. One aspect of a fast decompression algorithm is to use a fixed-size symbol for each of the words in the uncompressed cache line. The symbol provides the code to decompress the compressed cache line. Referring to FIG. 3, shown are exemplary coding for symbols in an embodiment with fixed-size symbols. An embodiment of the compression algorithm described herein uses a 4-bit symbol for each of the sixteen words (512 bits) in the uncompressed cache line. In addition to the 4-bit symbols, a shared pool of 32-bit dictionary entries and 16-bit data entries are allocated out of a total of 192 bits used to hold the data required for decompression. Multiple symbols may reference the same 32-bit dictionary constants, while 16-bit constants are associated with only one symbol. Note, that all data for a compressed cache line is contained entirely within the compressed line. In the exemplary embodiment, no symbols reference data from any other cache line, nor is there any other meta-data, aside from an indication in cache tag as to whether a line is compressed.

Some symbols require no data stored in the shared data pool to be expanded (i.e. those that encode 0x00000000 and 0xFFFFFFFF (where "0x" indicates a hexadecimal number follows)). Other symbols require only a 32-bit dictionary entry to be expanded, while others require only a 16-bit entry. Finally, there are some symbols that encode a situation where a 32-bit dictionary entry provides the most-significant 16-bits of the decompressed data, while the least-significant bits are pulled from a 16-bit value.

Referring to FIG. 4A, an exemplary compressed cache line is illustrated. The compressed cache line includes a 64-bit symbol portion 403 that provides sixteen 4-bit symbols. The symbols are encoded as shown in FIG. 3. Note that the compressed cache line also includes a data pool portion 405. The data portion 405 may contain up to six 32-bit dictionary entries (Dict0-Dict5). The 32-bit dictionary entries are stored starting at a fixed position in bits 191:160 immediately following the symbol portion of the compressed cache line. The dictionary data are allocated left to right as indicated by the arrow 407 in FIG. 4A. Each dictionary entry may correspond to more than one of the words in the compressed cache line.

The data portion may also contain 16-bit data entries as shown in FIG. 4B. There may be up to twelve 16-bit entries C0-C11, which are allocated right to left as indicated by the arrow. Each of the twelve 16-bit entries is unique to only one of the symbols and, therefore, only one of the words in the cache line. Thus, when decompressing the cache line, a 16-bit data entry may be used by only one word.

The data pool 405 may be shared by dictionary entries and 16-bit data entries. FIG. 4C shows an exemplary compressed cache line with four dictionary entries and three 16-bit data entries. Each of the dictionary entries may represent multiple words, while the 16-bit entries are associated, respectively, with only one word.

Referring back to the exemplary symbol encodings shown in FIG. 2, the first two symbols encoding 00xx and 010x indicate that a corresponding word matches the dictionary entry 0 . . . 3(0xx) or 4 . . . 5(10x). The next two symbol encodings 0110 and 0111 indicate that a corresponding word matches the constant 0x00000000 or 0xFFFFFFFF. The next five symbol encodings indicate that the corresponding word includes a 16-bit data word in conjunction with other bits to form the 32-bit uncompressed word. The coding 10xx indicates that the most significant bits of the word corresponding to the symbol matches the most significant sixteen bits of dictionary entry 0 . . . 3 (xx) and the least significant sixteen bits come from the 16-bit data stored in the data portion of the compressed cache line that is unique to the corresponding word. The symbol coding of 1100 indicates that the corresponding word matches the most significant sixteen bits of dictionary entry (Dict 4) for the most significant sixteen bits, and the least significant sixteen bits come from the 16-bit data stored in the data portion of the compressed cache line that is unique to the corresponding word. The coding 1101 indicates the uncompressed word includes two zero-extended bytes, e.g., 0x00aa00bb where aa and bb are from the 16-bit data stored in the data portion of the compressed cache line and unique to the corresponding word. That particular encoding is good for Unicode strings of ASCII characters. The coding 1110 indicates the uncompressed word includes 0x0000 as the most significant half-word, and the least significant half-word comes from the 16-bit data stored in the data portion of the compressed cache line and unique to the corresponding word. The coding 1111 indicates the uncompressed word includes 0xFFFF as the most significant half-word, and the least significant half-word comes from the 16-bit data stored in the data portion of the compressed cache line and unique to the corresponding word. When compressing the cache line, if a word does not match any of these terms, the next available dictionary entry is allocated and the 00xx or the 010x symbol that indexes the newly allocated entry is used.

FIG. 5 illustrates at a high level how encoded values in the cache are decoded according to an embodiment of the invention in which cache lines were compressed consistent with the coding of FIG. 3. In FIG. 5, a+ denotes concatenation and dictionary[2-bit index] [31:16] returns the sixteen most significant bits of the dictionary entry indexed by 2-bit index.

The embodiment illustrated in FIGS. 3 through 5 targets a 2:1 compression ratio; however, cache lines can be compressed 4:1 or 8:1 using the same approach. Essentially, these are cache lines for which ½ or ¾ of the bits in a 2:1 compressed cache line embodiment described in FIGS. 3 and 5 are "don't care" values and are unused for decompression. For example, assume each cache line has an additional bit of metadata (to the bit used to indicate whether the cache line is compressed for 2:1 compression) so that 00=uncompressed, 01=2:1 compressed, 10=4:1 compressed, and 11=8:1 compressed; then in the compression phase, if no dictionary or data entries are required (which can only occur if all data words in the cache line are either 0x0000000 or 0xFFFFFFFF), then the 8:1 compression tag is set. If only 64-bits of data is required (e.g., 2 dictionary entries and zero 16-bit data entries, 1 dictionary entry and two or fewer 16-bit data entries, or zero dictionary entries and 4 or fewer 16-bit data entries), then the 4:1 compression tag is set. Supporting 8:1 and 4:1 compression makes the resulting cache architecture more complex, but it can be beneficial for certain applications. For example, in applications such as compressing cache data transfers across a serial link such as HyperTransport™, adding 1 bit to each header to exploit 4:1 and 8:1 compression would be advantageous.

Figure 6:
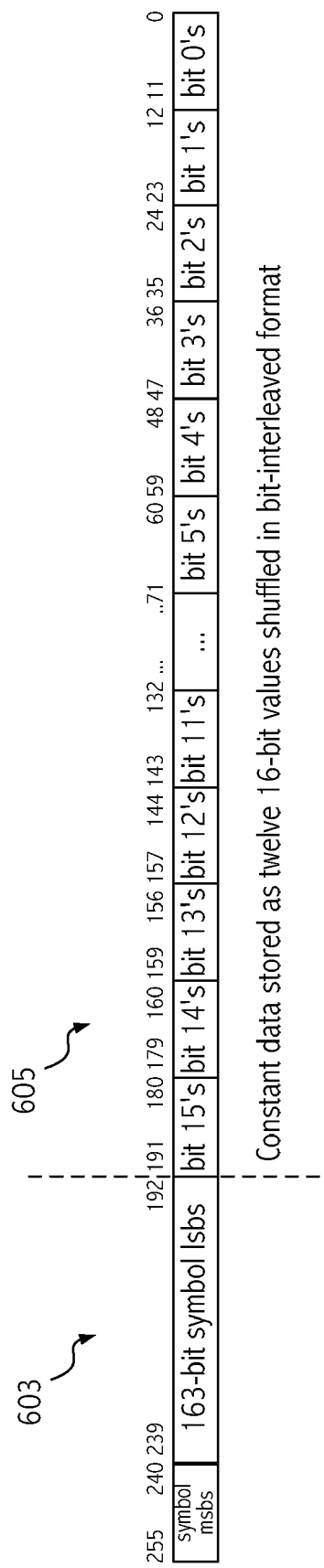
FIG. 6 illustrates an exemplary physical compressed cache line.

Before examining in greater detail the operation of the compression and decompressions logic (see FIG. 2), an exemplary physical layout of the compressed data is shown in FIG. 6. The physical layout shown in FIG. 6 corresponds to the logical layout shown in FIGS. 4A, 4B, and 4C. The physical layout includes the symbol portion 603 and the data pool portion 605. As shown in FIG. 6, the most significant bits (MSBs) of the sixteen 4-bit symbols are grouped together in bits 255-240. By placing bits used together as physically adjacent, timing may be improved and the logic simplified. Their use will become more apparent in the description that follows. That is followed by the least significant bits (LSBs) of the symbols. The data portion 605 stores data uniformly as 16-bit quantities, and each of the twelve 16-bit values are stored in a bit-interleaved format. This format keeps all twelve of the most significant bits of each 16-bit value in adjacent locations (bits 191:180) of the compressed cache data. Bit 14 for all twelve 16-bit values is stored in the twelve adjacent bits in locations 179:168 of the compressed cache data, and so forth, as twelve 16-bit data entries with bits in interleaved format (all bit 15s together, etc.), regardless as to whether the data portion contains 32-bit dictionary entries or 16-bit data entries. The physical format described in FIG. 6 may help reduce routing overhead and reduce wiring delays for certain embodiments. As decode delay can be a critical parameter, any reduction in delay can be advantageous.

The general overall structure of an embodiment of the decompression implementation is in parallel for each of the sixteen 32-bit decompressed words. The decompression logic determines which data (dictionary or data entries) in the data pool is being referenced, selects this data, and then decodes the symbol—using the selected data as needed to generate the decompressed word. A big source of the decompression logic complexity comes from determining the 16-bit data value that a given symbol may use. Since each symbol that uses a 16-bit data value has a symbol with the most-significant bit equal to one, the index (i.e., the location in the data pool) of a given symbol's 16-bit data value is determined by counting the number of 1s in the MSBs of all "earlier" symbols. For this implementation, "earlier" means all symbols to the left in the compressed cache line. Other embodiments may utilize a different bit position in the symbol and "earlier" may be processed in the opposite direction. In general, embodiments of the invention contemplate a fixed ordering when traversing the cache line or the compressed cache line such as sequentially left to right, right to left, odds then evens in one direction or a reverse direction, as long as a consistent ordering is maintained. This "population count" operation is used to select the correct 16-bit value. In an embodiment, the population count is determined as a binary value. In another embodiment, to improve timing, the population count is determined as a "one-hot" (one-of-n) value, where exactly one of twelve signals is asserted corresponding to a value of 0, 1, 2, . . . , 11. Note that it is an error in the particular embodiment being described for a signal corresponding to a count of more than twelve to ever be asserted, as there is only room for twelve 16-bit data values in the 24-byte data pool.

Figure 7:
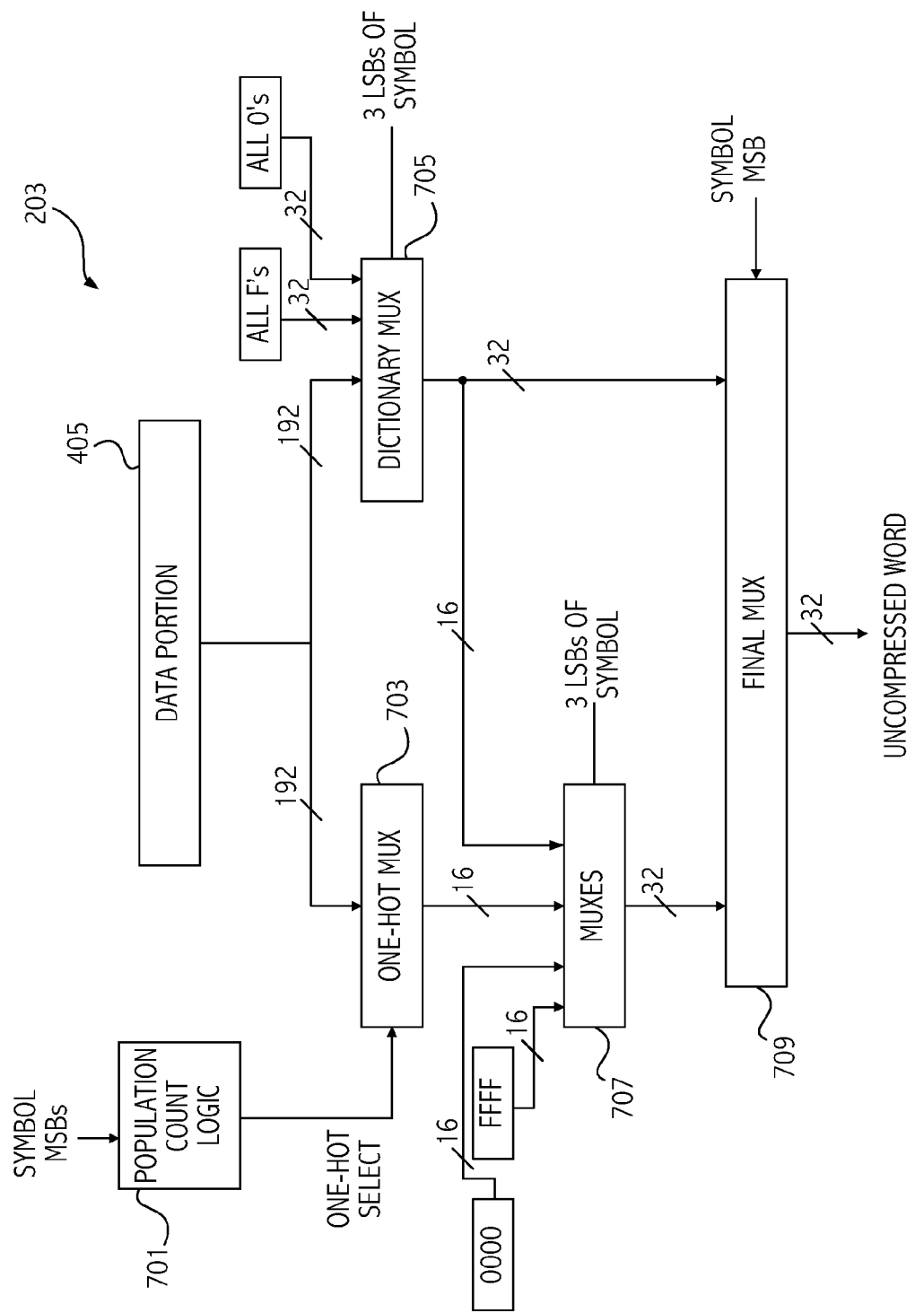
FIG. 7 illustrates a high-level block diagram of the decompression logic.

Referring to FIG. 7, a high-level block diagram of the decode logic 203 for one of the cache words is shown. The overall structure of the decompression is repeated in parallel for each of the sixteen 32-bit decompressed words. For each word, the decompression logic selects which 16-bit data entry (if any) and which 32-bit dictionary entry or constant (all zeros or all ones) (if any) and uses the selected values in conjunction with the 4-bit symbol to form the decompressed word. The decode logic includes a population count module 701 that receives the symbol MSBs and determines the one-hot population count as described above. That value serves as a multiplexer select for the one-hot multiplexer 703 to select the appropriate 16-bit data entry for the word from the twelve possible in the 192-bits of the data pool section of the compressed cache line. In addition, the three LSBs of the symbol provide the multiplexer select for multiplexer 705 to select one of the 32-bit dictionary entries of the six potential 32-bit dictionary entries from the data section of the compressed line or, alternately, the fixed values 0xFFFFFFFF or 0x00000000. The 16-bit output of the one-hot multiplexer 703 is then combined in additional multiplexer logic 707 to form the 32-bit uncompressed value in accordance with the symbol (zero extended, 0xFFFF extended, combined with MSBs of dictionary word or forming two zero extended bytes). Finally, the two 32-bit values from logic multiplexer 707 and dictionary multiplexer 705 are selected in multiplexer 709 as the decompressed word according to the MSB of the symbol. Note that FIG. 7 is intended to be an exemplary high-level illustration of an embodiment of the invention. Other approaches may be utilized to achieve the same results.

Figure 8:
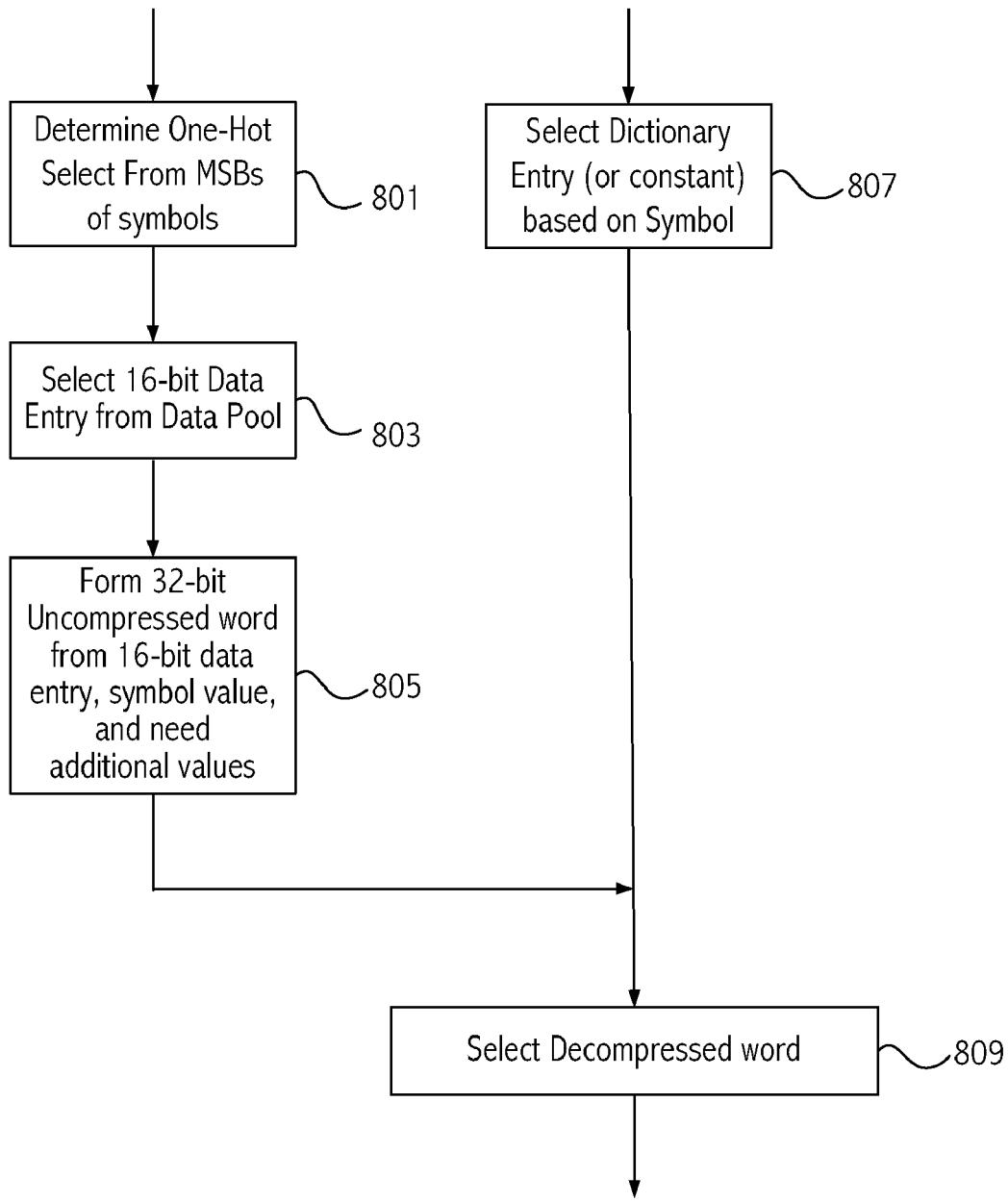
FIG. 8 illustrates a high-level flow diagram of the decompression logic.

FIG. 8 illustrates an overall flow diagram showing operation of the decompression logic from another perspective. At 801, the compression logic determines the one-hot select using the MSBs of other of the symbols in order to determine which 16-bit data entry in the data pool should be used to decompress the word. In 803, that data is selected from the data pool. At 805, the 32-bit uncompressed word is generated based on the 16-bit data entry from the data pool and the symbol encoding corresponding to the word. At 807, the dictionary entry or constant values (all ones or all zeros) is selected also based on the symbol coding. Finally, at 809, the 32-bit decompressed word is selected based either on the dictionary entry, a constant, or a 16-bit data entry. Note that certain of the operations, e.g., 801 and 807, may operate concurrently to minimize decompression latency.

Figure 9:
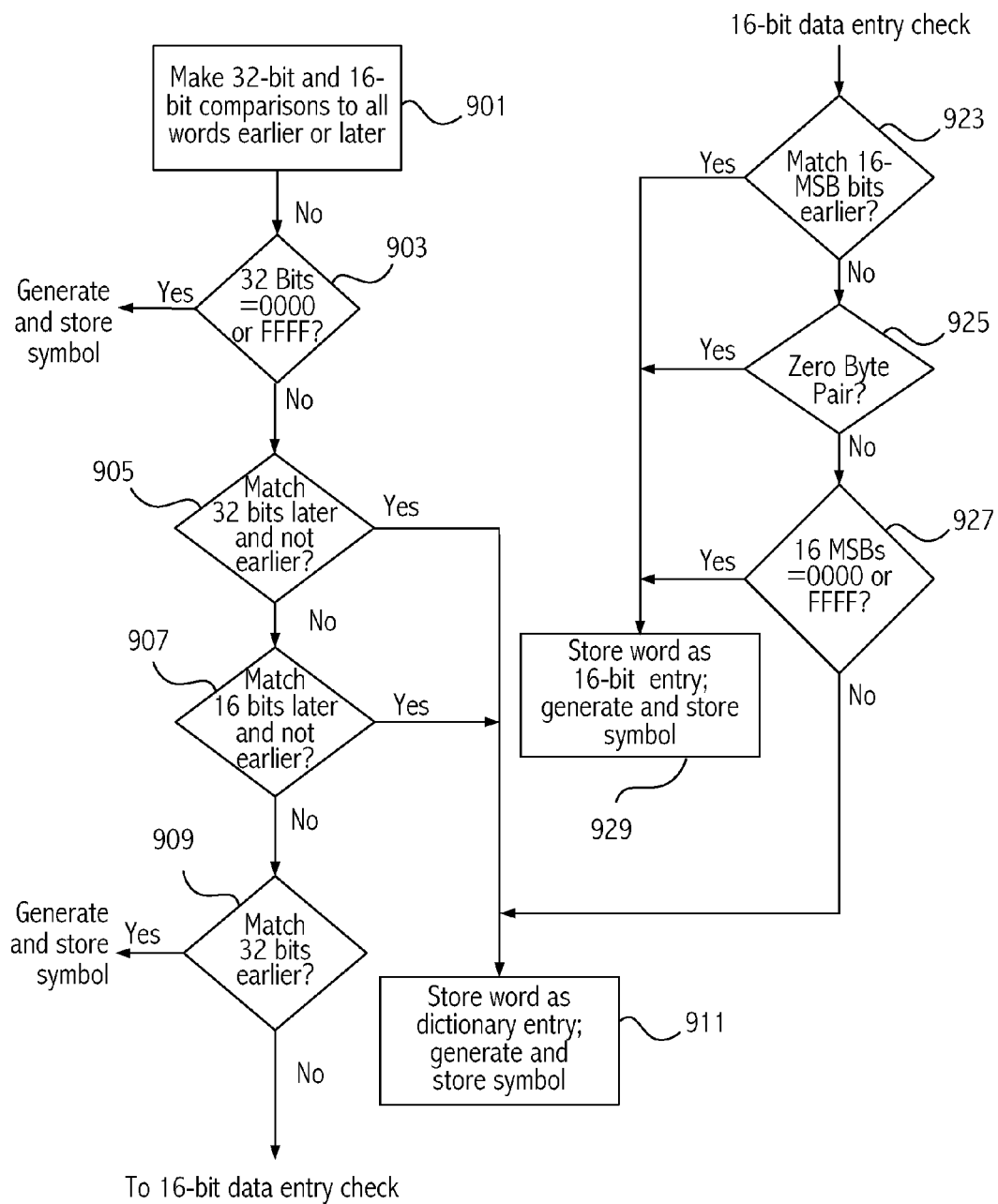
FIG. 9 illustrates a high-level flow diagram of a portion of the compression logic.

An embodiment of the high level functionality of the compression logic is described in the flow diagram of FIG. 9. According to an embodiment of the invention, in 901, the compression logic checks each 32-bit word in the uncompressed cache line for equality with every other 32-bit word, both earlier and later in the cache line. Also, the compression logic checks the most-significant sixteen bits of each word for equality with the most-significant sixteen bits of every other word, both earlier and later in the cache line. Conceptually, these comparisons result in two 15-bit match vectors for each 32-bit word indicating the match with all the other words (both full matches and most-significant 16-bit matches).

The compression logic checks in 903 to see if all 32 bits are equal to a predetermined value (e.g., all bits are ones or all bits are zeros). If the 32-bit word is equal to the predetermined value, a symbol is generated that corresponds to that cache line word indicating the predetermined value in accordance with, e.g., the symbol encodings of FIG. 3 (symbol 0110 or 0111). A word gets put in the data portion of the cache line as a 32-bit dictionary entry for several reasons. If either the word (905) or the most significant sixteen bits of the word (907) matches a later cache line word (and not an earlier cache line word) the word can be put in the dictionary. Again, traversal in a fixed ordering is presumed. So physically, what is "earlier" or "later" depends upon the nature of the fixed ordering (left to right, right to left, odds then evens, etc.). If the answer is yes in 905 or 907, the flow goes to 911 where the word is stored as a dictionary entry in the data portion of the cache line, and a symbol is generated in accordance with, e.g., the symbol encodings of FIG. 3 (the 00xx or 010x symbol). Similarly, the compression logic checks in 909 if the word is a 32-bit match for an earlier word. If so, the flow can go on to generating the symbol for the word in accordance with, e.g., the symbol encodings of FIG. 3, as no data pool entry is required,. If the answer is no in 903 through 909, the logic checks whether the word requires a 16-bit data entry in the data pool.

The compression logic determines in 923 whether a 16-bit data entry should be stored for the word by checking if the 16-bit MSBs of the word match the 16-bit MSBs of an earlier word. Remember that vectors were created for each word that provide an indication of the matches that exist (earlier and later) with other words. Additionally, in 925, the compression logic checks if the word has a zero byte pair in bits [31:24] and [15:8], and checks in 927 whether the word has all zeros in the most significant bits or all ones in the most significant bits (but not all ones or all zeros in the word). If the answer is yes to 923, 925, or 927, then the flow goes to 929 where the appropriate 16-bit portion of the word is stored as a 16-bit data entry and an appropriate symbol is generated and stored in the symbol portion of the compressed cache line in accordance with, e.g., the encodings of FIG. 3. In accordance with FIG. 3, coming to 929 from 925 or 927 results in a one of 1101, 1110, or 1111 as a symbol and coming to 929 from 923 results in 10xx or 1100 symbol.

Finally, if a 32-bit word does not meet any other criteria, such as matching earlier or being a 16-bit entry or matching a 32-bit constant, the word requires a dictionary entry in 911.

After the indication of how many 32-bit entries and how many 16-bit entries are required, a determination can be made as to whether the cache line is compressible. If there are too many entries, requiring more room than is available in the compressed cache line, the line is not compressible.

Figure 10:
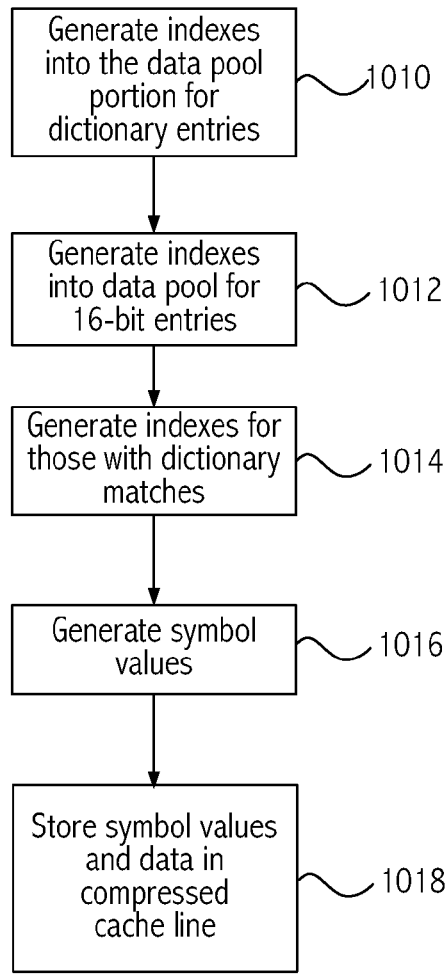
FIG. 10 illustrates a high-level flow diagram of another portion of the compression logic.

FIG. 10 provides additional details of generating the symbols and storing the dictionary and 16-bit entries. While decompression tends to have strict latency requirements, the compression operation can have less stringent performance requirements than decompression in some embodiments. Thus, in some embodiments, compression can take multiple cycles and may be implemented in a pipelined fashion. Thus, certain of the activities in FIGS. 9 and 10 may occur in different portions of the pipeline and in different clock cycles according to design requirements. Referring still to FIG. 10, in order to generate the appropriate symbols, e.g., in 911 and 929, the appropriate indexes into the data portion of the compressed cache line need to be determined. At 1010, the compression logic generates the indexes into the data pool portion of the cache line so that the 32-bit dictionary entries and/or the 16-bit data entries are stored in the appropriate locations in the compressed cache line. For each word that is a dictionary entry, the compression logic examines how many dictionary entries have already been allocated for words earlier in the cache line. For example, if two words earlier in the cache line have dictionary entries, then the appropriate index for the current word being considered would correspond to Dict2 (see FIG. 4A). Similarly, in 1012 the compression logic determines the index for words requiring a 16-bit entry based on how many 16-bit entries are required by earlier words in the cache line. In addition, in 1014, the compression logic determines for those words that had matched earlier dictionary entries, including those with earlier most significant 16-bit matches, what the identity is of the earliest match. That is used to generate the index for words that use dictionary entries of other words. The dictionary index value of the earliest match is the index for the later cache line word referring to that dictionary value. Thus, for example, multiple words may use the index dictionary entry Dict2 (see FIG. 4A), including words using that dictionary entry for a 16-bit most significant bit match.

Based on the indexes generated and the comparison information as to the type of matches made (to all zeros, all ones, earlier matches, later matches, most significant bit matches earlier and later, etc.), if any, the compression logic generates the symbol for the word in 1016.

The compression logic forms the compressed cache line in 1018. The compressed cache line structure can be thought of as a heavily multi-ported RAM, but a more typical implementation would be a multiplexing logic to select the right data for the 16-bit data entries and the 32-bit dictionary entries. The multiplexing logic is controlled based on the index values previously generated so the 16-bit data entries and the 32-bit dictionary entries go into the correct location in the compressed cache line. The symbol values are then stored in the compressed cache line with the data. In an embodiment as shown, the bits are interleaved as shown in FIG. 6, to provide greater efficiency.

Note that words can meet the criteria for multiple codes during compression. The particular code assigned in such situations may be to maximize compression efficiency and may be design dependent.

As previously stated, various embodiments of the invention utilize a consistent ordering of the cache line in evaluating compression and decompression. Thus, the compression logic may examine the cache line left to right or right to left, even and then odd, etc. In certain circumstances ordering dependencies may exist such that the order in which the compression logic examines the cache line, left to right or right to left, affects the compression. For example assume a cache line includes words: 0x12345678, 0x12345678, 0x1234ABCD, and assume all the other words in the cache line have MSBs that don't match 0x1234. If you consider left to right, the compression logic would assign 0x12345678 to the dictionary; the second occurrence would just reference that dictionary entry, and the 0x1234ABCD would refer to the dictionary entry and have a 16-bit data entry for 0xABCD. That results in a total of 6 bytes of data. If you evaluate right to left, then 0x1234ABCD goes into the dictionary (because the MSBs match MSBs of a later word), then the compression logic puts 0x12345678 into the dictionary (because the word matches a later word). Then the second occurrence of 0x12345678 will just refer to the dictionary value. That results in a total of 8 bytes of data.

In an embodiment, ordering dependencies may be prevented and thus improve compression (perhaps only slightly to the extent this ordering dependency happens) by preventing the above ordering dependency by having another term that qualifies using the msb_match_later to place an entry in the dictionary only if the term it is matching does not also have the exact "match_later" signal set. Note this may increase complexity of index calculations and thus may result in a tradeoff between improved compression ratios and increased complexity.

While embodiments of the invention have been described using specific symbol encodings, other symbol encodings may be used based on expected data values and particular applications. For example, while symbol codes were specified for all ones or all zeros, other data patterns may be of interest. Low order bits may be compared instead of, or in addition to, high order bits. While the fixed-size of the described symbol was four bits, other size symbols may be used, based, e.g., on the size of the cache line. In addition, the division of comparison fields into 16-bit fields could be changed. In applications dealing with compression of pixel data, 24-bit fields might be used. Alternatively, the LSB's might be the per-color channel LSBs (e.g. the 16-bit "LSBs" might be the concatenation of bits {[27:24],[19:16],[11:8][3:0]} in a typical RGBa pixel). Further, size of the compressed cache line can vary. Additional variations may be made to the symbols codings according to system requirements and applications.

Figure 11:
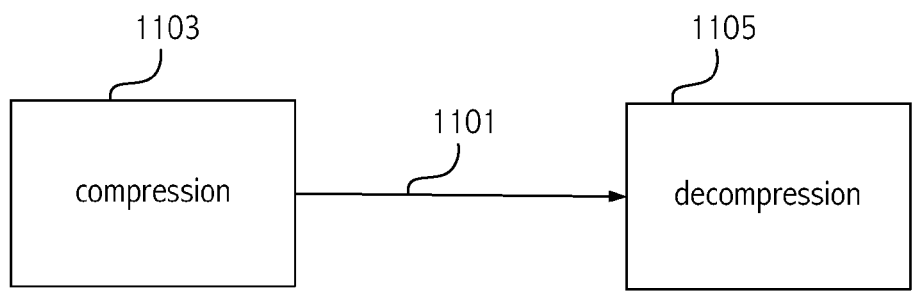
FIG. 11 illustrates an exemplary high level block diagram of a communication link using compression/decompression according to an embodiment of the invention.

In addition, while various embodiments of the invention have been described as useful in cache memories for compressing and decompressing cache lines, the approach described herein is applicable for compressing fixed-size blocks of data more generally. Thus, the compression approach can be applied to any data partitioned into fixed-size blocks. For example, as shown in FIG. 11, compression may be utilized to transfer compressed packets of data over a communication link 1101 or more generally any type of communication network. According to an embodiment of the invention, fixed-size data blocks, e.g., packets, are compressed in compression logic 1103 and transferred of the communication link 1101 to decompression logic 1105. A bit in the packet defines the packet as compressed or not. The compression and decompression logic are in accordance with various embodiments described herein. Compressing packets prior to transfer over the communication link and decompressing them on reception allows additional bandwidth to be available on the communication link. In addition, a data block may be compressed prior to being sent to storage in memory, e.g., main memory 107 (see FIG. 1) thereby reducing storage requirements in main memory as well as reducing memory bandwidth requirements. Memory controller 105 may provide both compression and decompression logic in such an embodiment.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and computer-readable medium having encodings thereon (e.g., HDL, Verilog, GDSII data) of such circuits, systems, and methods, as described herein. Computer-readable medium includes tangible computer readable medium e.g., a disk, tape, or other magnetic, optical, or electronic storage medium. In addition to computer-readable medium having encodings thereon of circuits, systems, and methods, the computer readable media may store instructions as well as data that can be used to implement the invention. Structures described herein may be implemented using software executing on a processor, firmware executing on hardware, or by a combination of software, firmware, and hardware.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. A method of compressing a data block comprising:
storing respective fixed-size symbols for each of a plurality of words in the data block in a symbol portion of a compressed data block, each of the symbols providing information about a corresponding one of the words in the data block;
storing in a data portion of the compressed data block a variable number of one or more data segments, each of the data segments corresponding to a unique one of the symbols in the compressed data block and a unique one of the words in the data block; and
storing in the data portion of the compressed data block a variable number of one or more dictionary entries, at least one of the dictionary entries corresponding to multiple ones of the symbols; and
wherein at least one of the words in the data block is represented in compressed form solely by one of the symbols and at least another of the words in the data block is represented in compressed form by one of the data segments in conjunction with another one of the symbols and a third one of the words of the data block is equal to a dictionary entry.

2. The method as recited in claim 1 wherein the data block is a cache line and the compressed data block is a compressed cache line.

3. The method as recited in claim 1 further comprising transmitting the compressed data block across a communication link.

4. The method as recited in claim 1 wherein each dictionary entry has a first bit length and each of the one or more data segments has a second bit length different from the first bit length.

5. The method as recited in claim 1 further comprising determining whether a particular one of the words is to be stored in the compressed data block as a dictionary entry according to, at least in part, whether the particular one of the words matches another one of the words in the data block.

6. The method as recited in claim 1 further comprising determining whether a particular one of the words is to be stored in the compressed data block as a dictionary entry according to, at least in part, whether only a portion of the particular one of the words matches a portion of another one of the words in the data block.

7. The method as recited in claim 1 further comprising determining whether a portion of a particular one of the words is to be stored in the data portion as one of the one or more data segments and uniquely associated with the particular one of the words, according to, at least in part, whether a first half-word of the particular one of the words matches a half-word of another of the words and storing a second half-word of the particular one of the words as the data segment.

8. The method as recited in claim 1 further comprising determining whether a portion of a particular one of the words is to be stored in the data portion as one of the one or more data segments and uniquely associated with the particular one of the words in the compressed data block according to whether the particular one of the words has a predetermined value as a first half-word and storing a second half-word of the particular one of the words as the one of the one or more data segments in the data portion of the compressed data block.

9. The method as recited in claim 1 further comprising determining whether a portion of a particular one of the words is to be stored in the data portion as one of the one or more data segments and uniquely associated with the particular one of the words according to whether the particular one of the words has two discontinuous bytes with a predetermined value.

10. The method as recited in claim 1 wherein a maximum number of the one or more data segments is twice a maximum number of the one or more dictionary entries.

11. The method as recited in claim 1 further coding a particular bit position of one of each fixed-size symbol having a corresponding data segment to have a predetermined value.

12. The method as recited in claim 11 further comprising storing the particular bit position for each of the symbols physically adjacent to one another in the compressed data block.

13. The method as recited in claim 11 further comprising allocating space for a first data segment in the compressed data block starting in position in the data portion of the compressed data block at an end in the compressed data block opposite from where a first dictionary entry is allocated.

14. A method of decompressing a compressed data block having a data portion and a symbol portion having a plurality of fixed-width symbols, to form a data block, the method comprising:
determining, according to a first symbol of the plurality of fixed-width symbols, that the first symbol has a corresponding data segment stored in the data portion;
determining, according to a second symbol of the plurality of fixed-width symbols that the second symbol has an associated dictionary entry, wherein the dictionary entry and the data segment are of different bit lengths; and
generating the data block to include a first word associated with the first symbol, the first word including the data segment, the data block further including at least a second word having a value equal to the dictionary entry specified by the second symbol, and the data block further including a third word equal to a predetermined value determined by a third symbol of the plurality of fixed-width symbols.

15. The method as recited in claim 14 wherein a first bit length of the data segment is half of a second bit length of the dictionary entry.

16. The method as recited in claim 14 further comprising determining which data segment in the data portion of the compressed data block is associated with a particular one of the symbols by counting how many of certain other symbols have a predetermined value in a particular bit position of their respective symbol.

17. The method as recited in claim 14 further comprising generating the data block utilizing one of the dictionary entries to generate multiple words in the data block.

18. The method as recited in claim 14 further comprising, based on a particular value of one of the fixed-width symbols, generating a decompressed word in the data block using the data segment for one portion of the word and part of the dictionary entry for a second portion of the decompressed word.

19. The method as recited in claim 14 further comprising, generating a decompressed word to have the data segment extended by one of all zeros and all ones.

20. The method as recited in claim 14 further comprising generating a decompressed word to include the data segment and having two discontinuous zero extended bytes.

21. The method as recited in claim 14 further comprising simultaneously decompressing each of the words in the compressed data block.

22. An apparatus comprising:
a compressed data block storage to store a compressed data block of a first plurality of words, the compressed data block storage including a symbol portion of equally sized symbols for each word stored in the compressed data block and a data portion, the data portion including a variable number of one or more word size dictionary entries and a variable number of one or more data segments, wherein each data segment is used to decompress only one word for the uncompressed data block, and each dictionary entry is used to decompress one or more of the words; and
selection logic coupled to the compressed data block to generate, according to a value of a first symbol associated with a particular one of the words a first decompressed word that includes as part of the decompressed word a data segment, to generate, according to a value of a second symbol associated with a second one of the words a second decompressed word that equals a dictionary entry, and, to generate, according to a value of a third symbol associated with a third one of the words a third decompressed word that has a predetermined value corresponding to the value of the third symbol;
wherein a location of the data segment in the data portion of the compressed data block is determined according to how many symbols for compressed words earlier in the data block have a predetermined value in a particular bit position of their respective symbol indicating a corresponding data segment.

23. The apparatus as recited in claim 22 further comprising:
decompression logic including the selection logic for each compressed word in the compressed data block to operate in parallel to decompress the compressed data block.

24. The apparatus as recited in claim 22 wherein the data segment is half of the dictionary entry in terms of bit length.

25. The apparatus as recited in claim 22 wherein the decompressed word includes a data segment for one portion of the word and part of a dictionary entry for a second portion of the decompressed word.

26. The apparatus as recited in claim 22 wherein each data segment in the compressed data block is used in only one decompressed word and at least one dictionary entry is used to form multiple decompressed words.

27. An apparatus comprising:
a data block storage to store a plurality of words;
a compressed data block storage having a symbol portion and a shared data pool portion;
determination logic to traverse the compressed data block in a fixed ordering and to determine to store a first word in the compressed data block storage as a dictionary entry in the shared data pool portion if the first word is equal to another word later in the fixed ordering and not earlier in the fixed ordering, and to determine to store the first word in the compressed data block storage as a dictionary entry if a first portion of the first word matches a second portion of another word later in the fixed ordering and does not match any word earlier in the fixed ordering; and
wherein the determination logic is further configured to determine to store half of a second word in the shared data pool portion if a particular portion of the second word matches one or more predetermined values, and if one portion of the second word matches a second portion of another word earlier in the fixed ordering.

28. The apparatus as recited in claim 27 wherein the determination logic comprises:
first comparison logic to compare each word in the data block to every other word in the data block to determine equality to words earlier and later in the data block and to store equality comparison results;
second comparison logic to compare a first portion of each word in the data block with a second portion of each of the other words in the data block to determine equality to words earlier and later in the data block and to store equality comparison results; and
third comparison logic to determine if respective ones of, or portions of, the words in the data block match one or more predetermined values.

29. The apparatus as recited in claim 27 further comprising determining whether a portion of a particular word is stored in the data portion as a data segment and uniquely associated with a particular word in the compressed data block according to whether the particular word has a predetermined one or more values as a most significant half-word and storing the least significant half-word as the data segment.

30. The apparatus as recited in claim 27 wherein the particular portion of the word is two discontinuous bytes.

31. The apparatus as recited in claim 27 wherein the particular portion of the word is a contiguous half-word.

32. The apparatus as recited in claim 27 wherein the data block is a cache line and the compressed data block is a compressed cache line.

33. The method as recited in claim 1 further comprising indicating a compression ratio associated with compressed data using a compression tag associated with the compressed data.

* * * * *